United States Patent
Li et al.

(10) Patent No.: US 9,949,383 B2
(45) Date of Patent: Apr. 17, 2018

(54) DISPLAY DEVICE

(71) Applicant: SHENZHEN CHINA STAR OPTOELECTRONICS TECHNOLOGY CO., LTD., Guangdong (CN)

(72) Inventors: Dehua Li, Guangdong (CN); Yu Chun Hsiao, Guangdong (CN); Gang Yu, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 14/778,188

(22) PCT Filed: Jun. 3, 2015

(86) PCT No.: PCT/CN2015/080721
§ 371 (c)(1),
(2) Date: Nov. 23, 2016

(87) PCT Pub. No.: WO2016/183881
PCT Pub. Date: Nov. 24, 2016

(65) Prior Publication Data
US 2017/0105291 A1    Apr. 13, 2017

(30) Foreign Application Priority Data
May 19, 2015  (CN) .......................... 2015 1 0257787

(51) Int. Cl.
*H05K 5/00*    (2006.01)
*H05K 5/03*    (2006.01)
*H05K 5/02*    (2006.01)

(52) U.S. Cl.
CPC ......... *H05K 5/0017* (2013.01); *H05K 5/0217* (2013.01); *H05K 5/03* (2013.01)

(58) Field of Classification Search
CPC combination set(s) only.
See application file for complete search history.

(56) References Cited

U.S. PATENT DOCUMENTS

| | | | |
|---|---|---|---|
| 9,372,301 B2* | 6/2016 | Hsiao .................. | G02B 6/0085 |
| 9,468,112 B2* | 10/2016 | Li ............................ | H05K 5/02 |
| 2008/0298003 A1* | 12/2008 | Pyo ....................... | G06F 1/1601 |
| | | | 361/679.02 |
| 2014/0061405 A1* | 3/2014 | Lee ....................... | F16M 13/02 |
| | | | 248/200 |
| 2014/0093330 A1* | 4/2014 | Hirasawa .............. | G02F 1/1333 |
| | | | 411/427 |
| 2014/0104504 A1* | 4/2014 | Kuwajima ............... | H05K 5/02 |
| | | | 348/843 |
| 2014/0177148 A1* | 6/2014 | Schurr .................. | H05K 5/0017 |
| | | | 361/679.01 |

(Continued)

Primary Examiner — Lisa Lea Edmonds
(74) Attorney, Agent, or Firm — Kim Winston LLP

(57) ABSTRACT

A display device is disclosed. The display device comprises a frame used for accommodating edges of a display panel, and a backplate that is arranged on a back side of the display panel, wherein the backplate contacts the frame and is connected with the frame through a connector. The backplate and the frame can be connected with each other stably by the connector, so that the display device has a stable structure, and the reliability of the display device can be effectively improved.

19 Claims, 1 Drawing Sheet

(56) References Cited

U.S. PATENT DOCUMENTS

| | | | |
|---|---|---|---|
| 2015/0208523 A1* | 7/2015 | Lee ......................... | H05K 5/02 361/679.01 |
| 2016/0135305 A1* | 5/2016 | Shin .................. | G02F 1/133308 361/694 |
| 2017/0094813 A1* | 3/2017 | Taniguchi ............ | H05K 5/0017 |

* cited by examiner

DISPLAY DEVICE

CROSS REFERENCE TO RELATED APPLICATION

The present application claims benefit of Chinese patent application CN 201510257787.4, entitled "Display Device" and filed on May 19, 2015, the entirety of which is incorporated herein by reference.

FIELD OF THE INVENTION

The present disclosure relates to the technical field of display, and particularly to a display device.

BACKGROUND OF THE INVENTION

With the popularity of display device (such as display device of televisions and computers) in industry and home appliance, there is an increasingly high requirement for the structure of the display device.

In the display device in the prior art, especially in a liquid crystal display device, a frame and a backplate thereof are generally connected with each other through arranging a viscous connection layer therebetween, such as water glue or double-sided adhesive, so that the assembling of the display device can be realized. However, the stability of this connection is poor, and thus dislocation would easily occur between the frame and the backplate. As a result, the structure of the display device is rather unreliable. In particular, the connection between the frame and the backplate would easily be broken by the action of an external force during transportation, and thus the display device would be destroyed.

Therefore, a display device with a stable structure is needed.

SUMMARY OF THE INVENTION

In order to solve the aforesaid technical problem, the present disclosure provides a display device with a stable structure.

The present disclosure provides a display device. The display device comprises a frame used for accommodating edges of a display panel, and a backplate that is arranged on a back side of the display panel, wherein the backplate contacts the frame and is connected with the frame through a connector.

In the display device according to the present disclosure, the backplate and the frame can be connected with each other stably through the connector, so that the backplate and the frame cannot be disconnected from each other easily. Therefore, the structure of the display device cannot be destroyed easily, and the structural stability and reliability of the display device can be guaranteed.

According to one embodiment, a first hole is arranged at a position where the backplate contacts the frame, and a second hole which matches the first hole is arranged in the frame. The connector is inserted into the first hole and the second hole for connecting the frame and the backplate. The connector is inserted into both the first hole and the second hole, so that a relative movement between the frame and the backplate can be prevented with the cooperation of the connector, the first hole, and the second hole. In this manner, the backplate and the frame can be connected with each other stably by this connection structure. The structure of the display device with this connection is simple, so that the structural compactness and the structural stability of the display device can both be improved. In addition, the manufacturing procedure of the display device can be simplified through this arrangement, and thus the assembling efficiency thereof can be improved. Moreover, a connection layer arranged between the frame and the backplate is no longer necessary, and thus the display device can be made thinner.

According to one embodiment, the connector comprises an inserting end which is inserted into the first hole and the second hole, and an abutting end which contacts a surface of the backplate away from the frame. The backplate and the frame can be connected with each other more closely through this connection, so that the structural stability and reliability of the display device can both be guaranteed.

According to one embodiment, a protrusion, which extends towards the backplate and is inserted into the first hole, is arranged on the frame, and the second hole is formed in the protrusion. When the display device is assembled, the frame can be pre-positioned through inserting the protrusion into the first hole, whereby the first hole can match the second hole more easily, and the connector can be inserted therein more conveniently.

According to one embodiment, the second hole is formed in a connecting wall of the frame that is adjacent to the backplate, and the display panel and the connecting wall are spaced from each other. The frame and the backplate can be connected with each other more stably with this structural arrangement, and the assembling difficulty of the display device can be reduced. In addition, the display panel and the connecting wall are spaced from each other, whereby the connector which runs through the second hole can be prevented from contacting the display panel directly. Therefore, it can be avoided that the display panel is destroyed by a relatively large force at a certain local region.

According to one embodiment, the display panel and the connecting wall are spaced from each other by a filling body that is arranged in the frame. The display panel and the connecting wall can be spaced from each other effectively by the filling body. In addition, a movement space of the display panel in the frame can be reduced by the filling body, so that the display panel can be fixed. Moreover, the deformation or destruction of the edges of the display panel can be prevented by the frame and the filling body. Therefore, the display panel can be protected effectively, and a normal operation thereof can be guaranteed.

According to one embodiment, the connector is a screw. The stability of the connection can be improved by the screw, so that the structural stability and reliability of the display device can be guaranteed. In addition, the screw is easy to be installed, which would facilitate the assembling of the display device. Moreover, the screw is detachable and can be replaced easily, and other structures of the display device would not be destroyed when the screw is installed or detached. Therefore, the reliability of the display device can be improved, and the lifetime thereof can be prolonged.

According to one embodiment, the backplate is provided with a covering element on one side thereof away from the frame, the covering element covering the connector. The connector is covered by the covering element and cannot be seen after the display device is assembled. With this structural arrangement, the connector cannot be easily accessed and installed or detached incorrectly by non-professionals. Therefore, the structural stability of the display device can be guaranteed. Moreover, the aesthetics of the display device can be improved since the connector is covered.

According to one embodiment, the covering element is configured as a frame body, and arranged on all edges of the backplate. In this case, not only the connector cannot be seen, but also the position of the connector cannot be observed easily. Therefore, it can be further avoided that the connector can be easily accessed. The display device can be further integrated, and the aesthetics of the display device can be further improved.

According to one embodiment, a part of the backplate which does not contact the frame bends along a direction away from the display panel, and the covering element is flush with a bending part of the backplate. The structural arrangement would facilitate the hiding of the connector, and thus the aesthetics of the display device can be further improved.

Compared with the prior art, the following advantages can be brought about according to the present disclosure. On the one hand, the backplate and the frame can be connected with each other stably through the connector, so that the backplate and the frame cannot be disconnected from each other easily. On the other hand, the structure of the display device cannot be destroyed easily, and the structural stability and reliability of the display device can be guaranteed.

BRIEF DESCRIPTION OF THE DRAWINGS

The present disclosure will be illustrated in detail hereinafter with reference to the embodiments and the drawings. In the drawings.

Figure 1:
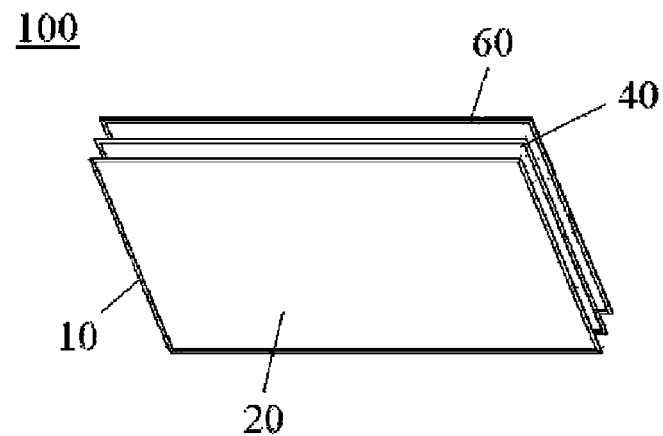
FIG. 1 roughly shows a structure of a display device according to one embodiment of the present disclosure.

In the drawings, a same component is represented by a same reference sign. The drawings are not drawn according to actual scale.

DETAILED DESCRIPTION OF THE EMBODIMENTS

The present disclosure will be further illustrated hereinafter with reference to the drawings.

Figure 2:
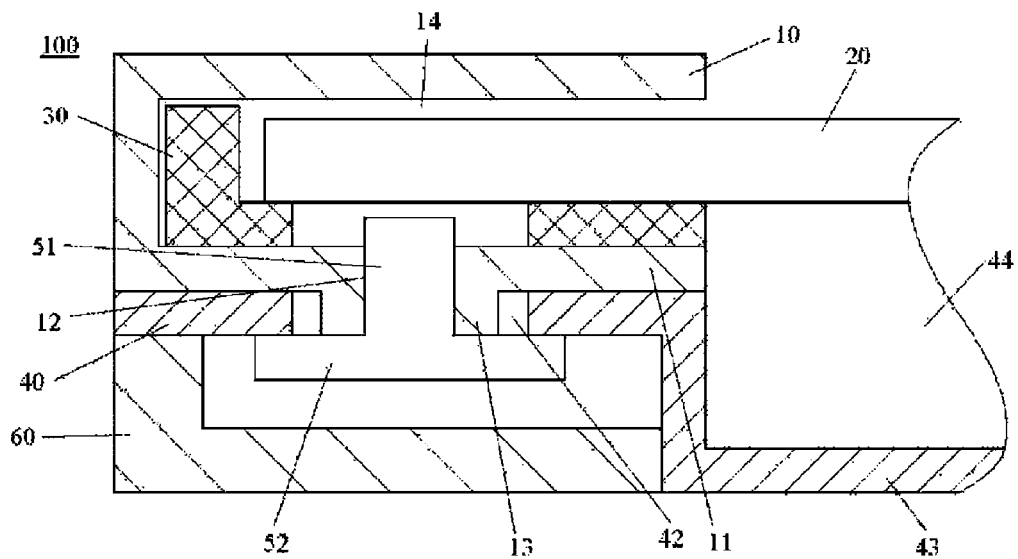
FIG. 2 is a partial connection diagram of the display device according to the embodiment of the present disclosure.

FIG. 1 and FIG. 2 schematically show a structure of a display device 100 according to the present disclosure.

The display device 100 comprises a frame 10. As shown in FIG. 1, the frame 10 is a groove-shaped frame having a roughly U-shaped section. An opening is provided at one end of the frame 10, and an accommodating cavity 14 is formed in the opening of the frame 10 for accommodating edges of the display panel 20, as shown in FIG. 2. The frame 10 can protect the display panel 20, so that deformation or destruction of the display panel 20 can be avoided. In addition, when the edges of the display panel 20 are destroyed, the frame 10 can accommodate fragments generated at the edges of the display panel 20, so that the safety of a user can be guaranteed.

The display device 100 further comprises a backplate that is connected with the frame 10. The backplate is connected with the frame 10 through a connector at edges thereof. The connector is preferably a rigid connector, which does not deform easily. The backplate and the frame can be connected with each other effectively through this connection, and the stability of the connection can be ensured. Therefore, the display device 100 has a stable structure, cannot be destroyed easily, and has a high reliability.

In addition, as shown in FIG. 2, a part of the backplate which does not contact the frame, i.e., the non-edge part of the backplate, bends away from the display panel so as to form a bending part 43. In this manner, a cavity 44 can be formed between the backplate 40 and the display panel 20 so as to accommodate optical components, such as a backlight source. It can be understood that, the optical components are well known to those skilled in the art, and the details of which are no longer repeated here.

It can be understood that, a viscous connection layer does not need to be arranged between the frame 10 and the backplate 40, and the frame and the backplate can be arranged directly adjacent to each other, as shown in FIG. 2. A connecting wall 11 of the frame 10 and the backplate 40 is roughly parallel to the display panel 20. In this case, the structure of the display device 100 is more compact, and thus the display device 100 can be made thinner. Therefore, the ultra-thin design of the display device 100 can be realized. However, it can be understood that, a structure with other functions can also be arranged between the frame 10 and the backplate 40 if necessary.

As shown in FIG. 2, in order to guarantee that the backplate 40 and the frame 10 can be connected with each other stably, a first hole 42, i.e., a through hole, can be arranged at one edge of the backplate 40, and a second hole 12 can be arranged at a corresponding position of the frame 10. A relative movement between the backplate 40 and the frame 10 in a direction perpendicular to an inserting direction of the connector can be prevented through inserting the connector into the first hole 42 and the second hole 12. The inserting direction of the connector is a moving direction when the connector is inserted into the first hole 42 and the second hole 12, and is roughly perpendicular to a surface of the display panel 20. That is, when the relative movement between the frame 10 and the backplate 40 in the direction perpendicular to the inserting direction of the connector was going to happen, a shear force on the connector would be generated by the frame 10 and the backplate 40. The shear force can be offset by the connector, so that the relative movement between the frame 10 and the backplate 40 cannot happen.

Here, it can be understood that, the frame 10 and the backplate 40 can also be connected with each other by the connector through fastening or other connection means.

According to one embodiment, the connector is connected with both a hole wall of the first hole 42 and a hole wall of the second hole 12, so that the backplate 40 and the frame 10 can be connected with each other. In this manner, a relative movement between the backplate 40 and the frame 10 in any direction can be prevented.

According to one preferred embodiment, as shown in FIG. 2, the connector comprises an inserting end 51 which is inserted into the first hole 42 and the second hole 12, and an abutting end 52 which abuts on one side of the backplate 40 away from the frame 10. The inserting end 51 is connected with the hole wall of the second hole 12. A size of the abutting end 52 is larger than a size of the first hole 42, so that the abutting end 52 cannot pass through the first hole 42. In this case, after the inserting end 51 is inserted into the second hole 12, once the backplate 40 is inclined to move away from the frame 10, the backplate 40 would be stopped by the abutting end 52, so that the movement trend can be eliminated. That is, relative movements between the backplate 40 and the frame 10 in the inserting direction and in the direction perpendicular to the inserting direction can both be prevented by this connection, and thus the relative movement between the backplate 40 and the frame 10 in any direction can be prevented. Moreover, it can be arranged that a certain pressure is generated to the backplate 40 by the abutting end 52 when the connector is inserted therein, so that the backplate 40 and the frame 10 can be connected with each other more closely, and the relative movement between the frame 10 and the backplate 40 can be further prevented. Therefore, the connection stability between the backplate 40 and the frame 10 can be improved, and thus the structural stability and reliability of the display device 100 can be improved accordingly.

In a variant, the connector can only pass through the first hole 42 but without contacting the hole wall thereof, while is inserted into the second hole 12 and contact with the hole wall thereof. The positioning of the second hole 12, the first hole 42, and the connector becomes easier with this connection, so that the assembling difficulty of the display device 100 can be reduced, and the assembling efficiency thereof can be improved.

In addition, as shown in FIG. 2, a protrusion 13 can be arranged on the frame 10 at a position corresponding to the first hole 42. The protrusion 13 extends towards the backplate 40, and can be inserted into the first hole 42. In this case, the frame 10 and the backplate 40 can be pre-positioned before the connector is arranged therein. Therefore, the assembling of the display device 100 can be simplified, and the assembling efficiency thereof can be greatly improved.

As shown in FIG. 2, the second hole 12 can be arranged in the protrusion 13, and the second hole 12 is preferably a through hole. The connector can be inserted into the whole of the second hole 12, and the second hole 12 can be prolonged by the structure of the protrusion 13. In this case, a connection area between the connector and the second hole 12 can be increased, and thus the connection stability between the connector and the frame 10 can be improved.

Preferably, the protrusion 13 extends to the first hole 42 but does not pass through the first hole 42, so that the contact between the abutting end 52 of the connector and the backplate 40 would not be affected by the protrusion 13.

The connector can be preferably a screw. The screw is provided with male screw on the inserting end 51 thereof, and the second hole 12 is provided with corresponding female screw on the hole wall thereof so as to engage with the male screw of the screw. If the inserting end 51 is connected with the hole wall of the first hole 42, the first hole 42 should also be provided with female screw on the hole wall thereof. In this manner, the connector can be connected with the frame 10 more stably, and thus the structural reliability of the display device 100 can be further improved. In addition, the screw can be installed to the second hole 12 more conveniently, so that the assembling of the display device 100 can be simplified, and the assembling efficiency thereof can be improved. Moreover, the screw can be installed and detached, and the structures of the backplate 40 and the frame 10 would not be destroyed during the installation and detachment. In this case, the connector can be replaced or adjusted more conveniently, so that the structural reliability of the display device 100 can be improved, and the lifetime thereof can be prolonged.

As shown in FIG. 2, the backplate 40 is provided with a covering element 60 on one side thereof away from the frame 10 so as to cover the connector. The covering element 60 can cover the connector in a contact manner or in a non-contact manner, as shown in FIG. 2. In this case, after the display device 100 is assembled, the connector cannot be seen, while only the covering element 60 which covers the connector can be seen. Therefore, the aesthetics of the display device 100 can be improved. More importantly, it can be avoided that the connector is installed or detached incorrectly and the structure of the display device 100 is destroyed. In this manner, the structural integrity of the display device 100 can be guaranteed, and the using safety thereof can be improved.

Preferably, as shown in FIG. 1, the covering element 60 can be configured as a frame body which covers all edges of the backplate 40. In this case, the integrity of the display device 100 can be improved. Therefore, the installation position of the connector cannot be obtained by the user directly, and the appearance of the display device 100 can be further optimized.

Preferably, as shown in FIG. 2, the covering element 60 can be arranged flush with the bending part 43 of the backplate. In this case, the covering element can be integrated with the backplate, so that the connector can be further hidden, and the aesthetics of the display device 100 can be further improved.

Moreover, it should be arranged that the display panel 20 does not contact the connector, so that the connector can be installed successfully. In addition, a pressure generated by the connector on the display panel 20 can be avoided, and thus the stress concentration phenomenon on the edges of the display panel 20 can be avoided. Therefore, the deformation or destruction of the display panel 20 can be avoided, and the structural stability and integrity of the display panel 20 can be guaranteed.

It can be understood that, in order to guarantee that the connector and the frame 10 can be connected with each other more stably, the connector should be arranged extending into the accommodating cavity 14 after passing through the second hole 12. Here, in order to prevent the contact between the display panel 20 and the connector, the display panel 20 can be arranged far from the connecting wall 11 of the frame 10. In this case, a space can be left between the display panel 20 and the connecting wall 11, and thus the connector can extend into the accommodating cavity 14. Preferably, as shown in FIG. 2, the frame 10 is provided with a filling body 30 so as to fill the aforesaid space, and thus the connector and the display panel 20 are separated from each other. That is, the display panel 20 and the connecting wall 11 of the frame 10 can be spaced from each other by the filling body 30. Here, it can be understood that, a hole should be arranged in the filling body 30 at a position corresponding to the second hole 12 so as to leave a space for the inserting end 51 of the connector, and thus the inserting end 51 can be inserted into a position exceeding the second hole 12.

The filling body 30 is made of an elastic material, and is preferably an elastic frame. When shock is exerted on the display panel 20, it can be absorbed by the filling body 30. Preferably, the filling body 30 is configured as a structure extending into a space between the edges of the display panel 20 and the frame 10. In this case, when the display panel 20 moves in a horizontal direction as shown in FIG. 2 towards the frame 10, the filling body 30 can play the role of buffering, so that the deformation or destruction of the display panel 20 can be avoided. In addition, it can be arranged that the filling body 30 and the display panel 20 fill the accommodating cavity 14 of the frame 10 fully, so that the position of the display panel 20 can be fixed. In this manner, the structure of the display device 100 can be more compact, and the structural reliability thereof can be improved.

The display device 100 according to the present disclosure can be assembled by the following steps.

First, the filling body 30 is inserted into the frame 10, and the display panel 20 is installed to the frame 10.

Then, the backlight source and other optical components are arranged in the bending part 43 of the backplate 40, and the backplate 40 and the frame 10 are arranged together so as to form the cavity 44 to accommodate the optical components. At the same time, the first hole 42 of the backplate 40 and the second hole 12 of the frame 10 are arranged at corresponding positions.

Next, the connector is inserted into the first hole 42 and the second hole 12, so that the backplate 40 and the frame 10 can be connected with each other.

At last, the covering element 60 is arranged on the edges of the backplate 40 so as to cover the connector.

The display device 100 according to the present disclosure can be assembled in the aforesaid assembling method. The display device 100 has a compact structure, and can be made thinner. In addition, the assembling procedure of the display device 100 is simple, and thus the assembling efficiency thereof can be improved. Moreover, the connector of the display device cannot be seen, so that the aesthetics of the display device 100 can be improved. The structure of the aforesaid display device 100 is especially applicable for the ultra-thin display device.

The present disclosure is illustrated in detail in combination with preferred embodiments hereinabove, but it can be understood that the embodiments disclosed herein can be improved or substituted without departing from the protection scope of the present disclosure. In particular, as long as there are no structural conflicts, the technical features disclosed in each and every embodiment of the present disclosure can be combined with one another in any way, and the combined features formed thereby are within the protection scope of the present disclosure. The present disclosure is not limited by the specific embodiments disclosed herein, but includes all technical solutions falling into the protection scope of the claims.

The invention claimed is:

1. A display device, comprising:
a frame used for accommodating edges of a display panel; and
a backplate that is arranged on a back side of the display panel, wherein the backplate contacts the frame and is connected with the frame through a connector,
wherein the backplate is provided with a covering element on one side thereof away from the frame, the covering element covering the connector.

2. The display device according to claim 1, wherein the connector is a screw.

3. The display device according to claim 1, wherein the covering element is configured as a frame body, and arranged on all edges of the backplate.

4. The display device according to claim 1, wherein a part of the backplate which does not contact the frame bends along a direction away from the display panel; and
wherein the covering element is flush with a bending part of the backplate.

5. The display device according to claim 1, wherein a first hole is arranged at a position where the backplate contacts the frame, and a second hole which matches the first hole is arranged in the frame; and
wherein the connector is inserted into the first hole and the second hole for connecting the frame and the backplate.

6. The display device according to claim 5, wherein a protrusion, which extends towards the backplate and is inserted into the first hole, is arranged on the frame, and the second hole is formed in the protrusion.

7. The display device according to claim 5, wherein the second hole is formed in a connecting wall of the frame that is adjacent to the backplate; and
wherein the display panel and the connecting wall are spaced from each other.

8. The display device according to claim 7, wherein the display panel and the connecting wall are spaced from each other by a filling body that is arranged in the frame.

9. The display device according to claim 5, wherein the backplate is provided with a covering element on one side thereof away from the frame, the covering element covering the connector.

10. The display device according to claim 9, wherein the covering element is configured as a frame body, and arranged on all edges of the backplate.

11. The display device according to claim 9, wherein a part of the backplate which does not contact the frame bends along a direction away from the display panel; and
wherein the covering element is flush with a bending part of the backplate.

12. The display device according to claim 5, wherein the connector comprises an inserting end which is inserted into the first hole and the second hole, and an abutting end which contacts a surface of the backplate away from the frame.

13. The display device according to claim 12, wherein a protrusion, which extends towards the backplate and is inserted into the first hole, is arranged on the frame, and the second hole is formed in the protrusion.

14. The display device according to claim 12, wherein the second hole is formed in a connecting wall of the frame that is adjacent to the backplate; and
wherein the display panel and the connecting wall are spaced from each other.

15. The display device according to claim 14, wherein the display panel and the connecting wall are spaced from each other by a filling body that is arranged in the frame.

16. The display device according to claim 12, wherein the connector is a screw.

17. The display device according to claim 12, wherein the backplate is provided with a covering element on one side thereof away from the frame, the covering element covering the connector.

18. The display device according to claim 17, wherein the covering element is configured as a frame body, and arranged on all edges of the backplate.

19. The display device according to claim 17, wherein a part of the backplate which does not contact the frame bends along a direction away from the display panel; and
wherein the covering element is flush with a bending part of the backplate.

* * * * *